US012628684B2

(12) United States Patent
Lee et al.

(10) Patent No.: US 12,628,684 B2
(45) Date of Patent: May 12, 2026

(54) SEMICONDUCTOR PACKAGE

(71) Applicant: SAMSUNG ELECTRONICS CO., LTD., Suwon-si (KR)

(72) Inventors: Jeonghyun Lee, Seoul (KR); Hwanpil Park, Hwaseong-si (KR); Jongbo Shim, Asan-si (KR); Eunsu Lee, Suwon-si (KR); Jangwoo Lee, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 883 days.

(21) Appl. No.: 17/841,155

(22) Filed: Jun. 15, 2022

(65) Prior Publication Data
US 2023/0114274 A1     Apr. 13, 2023

(30) Foreign Application Priority Data
Oct. 8, 2021     (KR) ........................ 10-2021-0134153

(51) Int. Cl.
*H01L 23/31*          (2006.01)
*H01L 23/498*         (2006.01)
(Continued)

(52) U.S. Cl.
CPC .... *H01L 23/3128* (2013.01); *H01L 23/49816* (2013.01); *H10D 1/68* (2025.01);
(Continued)

(58) Field of Classification Search
CPC .................. H10D 1/68; H01L 23/3128; H01L 23/49816; H01L 24/05; H01L 24/13
See application file for complete search history.

(56) References Cited

U.S. PATENT DOCUMENTS 6,518,666 B1 *   2/2003   Ikeda ................... H05K 1/0231
                                                          257/738
6,576,998 B1     6/2003   Hoffman
(Continued)

FOREIGN PATENT DOCUMENTS

| JP | 2003-309213 A | 10/2003 |
|---|---|---|
| JP | 2007-035870 A | 2/2007 |
| JP | 2012-074505 A | 4/2012 |
| KR | 20230050992 A | 4/2023 |

*Primary Examiner* — Britt Hanley
*Assistant Examiner* — Victor V Barzykin
(74) *Attorney, Agent, or Firm* — Wolf, Greenfield & Sacks, P.C.

(57)          ABSTRACT

A semiconductor package includes a redistribution structure having a first surface, an opposite second surface, and a redistribution layer between the first surface and the second surface. A semiconductor chip is on the first surface of the redistribution structure and is electrically connected to the redistribution layer. An encapsulant is on at least a portion of the semiconductor chip. A passive element is on the second surface of the redistribution structure. The passive element includes a connection surface facing the second surface, a connection terminal on the connection surface, a non-connection surface opposite to the connection surface, and a side surface extending from the connection surface to the non-connection surface. A connection bump is adjacent the passive element on the second surface and is electrically connected to the redistribution layer. A sealing material is on at least a portion of the connection surface, the non-connection surface, and the side surface of the passive element.

19 Claims, 8 Drawing Sheets

100A

(51) Int. Cl.
　　　*H10D 1/68*　　　　　(2025.01)
　　　*H01L 23/00*　　　　　(2006.01)

(52) U.S. Cl.
　　　CPC ............. *H01L 24/05* (2013.01); *H01L 24/13*
　　　　　(2013.01); *H01L 24/16* (2013.01); *H01L 24/81*
　　　　　(2013.01); *H01L 2224/0401* (2013.01); *H01L*
　　　　　*2224/05624* (2013.01); *H01L 2224/05647*
　　　　　(2013.01); *H01L 2224/131* (2013.01); *H01L*
　　　　　*2224/16227* (2013.01); *H01L 2224/81411*
　　　　　(2013.01); *H01L 2224/81416* (2013.01); *H01L*
　　　　　*2224/81424* (2013.01); *H01L 2224/81439*
　　　　　(2013.01); *H01L 2224/81444* (2013.01); *H01L*
　　　　　*2224/81447* (2013.01); *H01L 2224/81455*
　　　　　(2013.01); *H01L 2224/81466* (2013.01); *H01L*
　　　　　*2924/014* (2013.01)

(56)　　　　　　　References Cited

U.S. PATENT DOCUMENTS

| | | | |
|---|---|---|---|
| 7,268,002 B2 | 9/2007 | Koide et al. | |
| 9,171,797 B2 | 10/2015 | Lin et al. | |
| 10,373,884 B2 | 8/2019 | Kim et al. | |
| 10,522,454 B2 | 12/2019 | Meyer et al. | |
| 2015/0070864 A1* | 3/2015 | Rainer | H01L 25/0655 |
| | | | 438/126 |
| 2017/0287853 A1* | 10/2017 | Kim | H01L 23/3128 |
| 2018/0151530 A1* | 5/2018 | Chen | H01L 24/14 |
| 2019/0013301 A1* | 1/2019 | Cheah | H01L 21/6836 |
| 2021/0098192 A1 | 4/2021 | Leary et al. | |
| 2023/0110126 A1 | 4/2023 | Lee et al. | |

* cited by examiner

100B

S1 150 120 125 121

170 S2 166 161 160 / 111c 111 112 113 111b 111a

B 110

Z
Y●→X

165a 111a 111 112 (P1) 163a 162a TR 112 (P2) 165b (163b)

S2
160S1
160S3
160S2

160a(160) 166 166RS 161a 161b 160b(160)

Z
Y●→X

B

SEMICONDUCTOR PACKAGE

CROSS-REFERENCE TO RELATED APPLICATION(S)

This application claims benefit of priority to Korean Patent Application No. 10-2021-0134153 filed on Oct. 8, 2021 in the Korean Intellectual Property Office, the disclosure of which is incorporated herein by reference in its entirety.

BACKGROUND

The present inventive concept relates to a semiconductor package.

Semiconductor packages in which a high-performance semiconductor chip is embedded may have problems, such as malfunctions and system performance degradation due to voltage noise occurring in a high-frequency band. Therefore, there is a need for improved packaging technology.

SUMMARY

An aspect of the present inventive concept is to provide a semiconductor package having improved power integrity (PI) characteristics.

According to an aspect of the present inventive concept, a semiconductor package includes a redistribution structure having a first surface, an opposite second surface, and a redistribution layer between the first surface and the second surface; a semiconductor chip on the first surface of the redistribution structure and electrically connected to the redistribution layer; an encapsulant on the semiconductor chip on the first surface of the redistribution structure; a passive element on the second surface of the redistribution structure, the passive element having a connection surface facing the second surface of the redistribution structure, a connection terminal on the connection surface, a non-connection surface opposite to the connection surface, and a side surface extending from the connection surface to the non-connection surface; a connection bump on the second surface of the redistribution structure and electrically connected to the redistribution layer, wherein the connection bump is adjacent to the passive element; and a sealing material on each of the connection surface, the non-connection surface, and the side surface of the passive element.

According to an aspect of the present inventive concept, a semiconductor package includes a redistribution structure having a first surface, an opposite second surface, and a redistribution layer between the first surface and the second surface; a semiconductor chip on the first surface of the redistribution structure and electrically connected to the redistribution layer; a first passive element on the second surface of the redistribution structure, the first passive element including a first connection terminal and a first connection member electrically connecting the first connection terminal to the redistribution layer; a second passive element on the second surface of the redistribution structure and electrically connecting the second connection terminal to the redistribution layer; and a sealing material on the first passive element, wherein the first passive element includes a silicon (Si) capacitor and the second passive element includes a ceramic capacitor.

According to an aspect of the present inventive concept, a semiconductor package includes: a redistribution structure including a plurality of insulating layers and a plurality of redistribution layers between the plurality of insulating layers, wherein an uppermost one of the plurality of insulating layers forms a first surface of the redistribution structure, and wherein a lowermost one of the plurality of insulating layers forms an opposite second surface of the redistribution structure; a semiconductor chip on the first surface of the redistribution structure and electrically connected to the redistribution layer; a passive element on the second surface of the redistribution structure, the passive element having a connection surface facing the second surface, an opposite non-connection surface, and a connection terminal on the connection surface; and a sealing material on the non-connection surface of the passive element, wherein the lowermost one of the plurality of insulating layers has a trench therein at the second surface of the redistribution structure, and wherein the sealing material is in the trench.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1A:
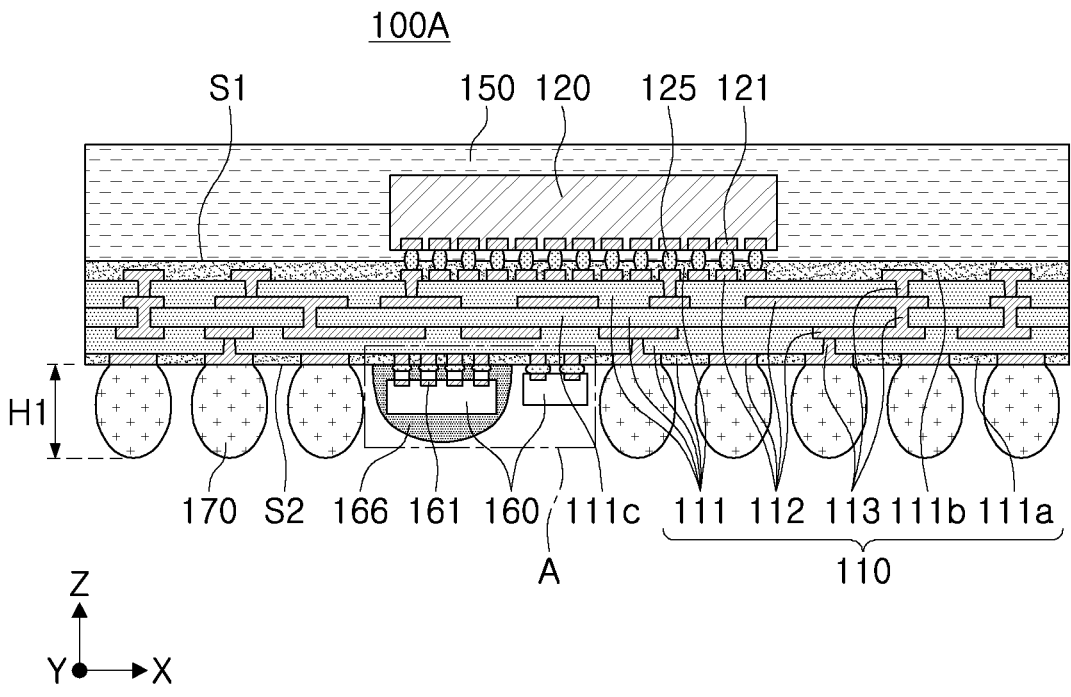
FIG. 1A is a cross-sectional view illustrating a semiconductor package according to an example embodiment of the present inventive concept.
Figure 1B:
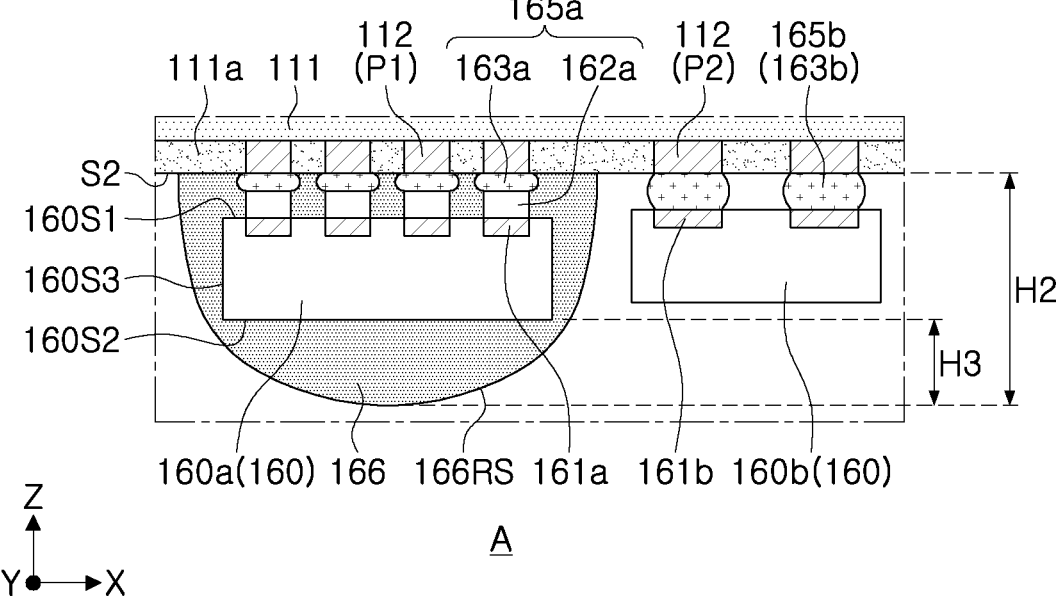
FIG. 1B is a partially enlarged view illustrating region 'A' of FIG. 1A.
Figure 1C:
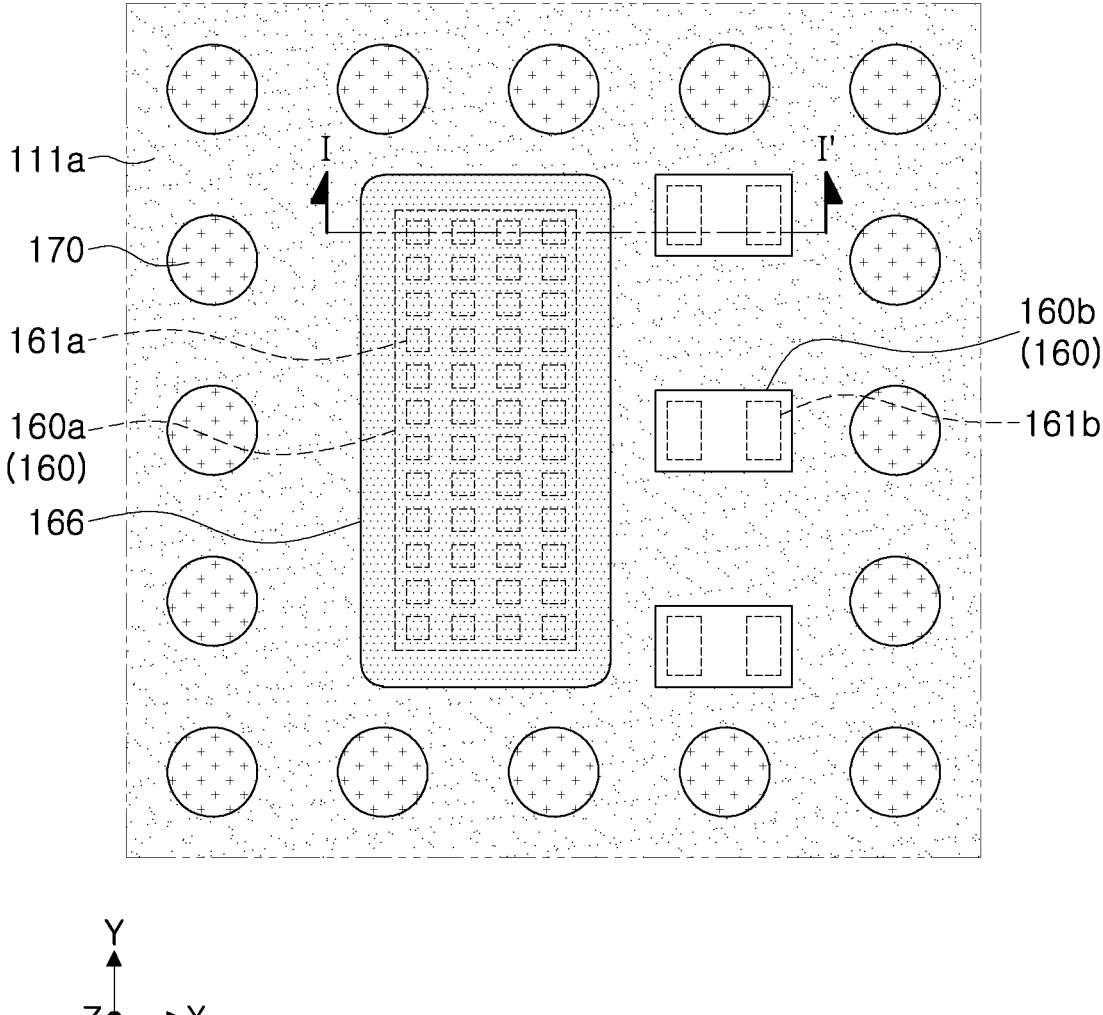
FIG. 1C is a plan view illustrating a portion of a lower surface of a semiconductor package including a portion illustrated in FIG. 1B.

FIG. 1A is a cross-sectional view illustrating a semiconductor package 100A according to an example embodiment of the present inventive concept, FIG. 1B is a partially enlarged view illustrating region 'A' of FIG. 1A, and FIG. 1C is a plan view illustrating a portion of a lower surface of the semiconductor package 100A including a portion illustrated in FIG. 1B. FIG. 1B is a cross-sectional view taken along line I-I' of FIG. 1C.

Referring to FIGS. 1A to 1C, a semiconductor package 100A according to an example embodiment may include a redistribution structure 110, a semiconductor chip 120, a passive element 160, and a sealing material 166. The semiconductor package 100A according to an example embodiment may further include an encapsulant 150 and a connection bump 170. In the present inventive concept, signal integrity (SI) and/or power integrity (PI) characteristics of the semiconductor package 100A may be improved by surface-mounting at least one passive element 160 on one surface of the redistribution structure 110. In addition, by introducing the sealing material 166 covering an exposed surface of the passive element 160, damage to the passive element 160 may be prevented and reliability of the semiconductor package 100A may be improved.

The redistribution structure 110 is a support substrate on which the semiconductor chip 120 is mounted, and may be a package substrate for redistribution of a connection pad 121 of the semiconductor chip 120. The package substrate may include a printed circuit board (PCB), a ceramic substrate, a glass substrate, a tape wiring board, and the like. For example, the redistribution structure 110 may include a first surface S1 and a second surface S2 opposing each other, an insulating layer 111, a redistribution layer 112, and a redistribution via 113.

The insulating layer 111 may include an insulating resin. The insulating resin may include a thermosetting resin such as an epoxy resin, a thermoplastic resin such as polyimide, or a resin impregnated with an inorganic filler and/or glass fiber (glass cloth, glass fabric) in these resins, for example, a prepreg, ABF, FR-4, BT, or a photosensitive resin such as photo-imageable dielectric (PID). The insulating layer 111 may include a plurality of insulating layers 111 stacked in a vertical direction (Z-axis direction). Among the plurality of insulating layers 111, the uppermost insulating layer 111b may provide a first surface S1, and the lowermost insulating layer 111a may provide a second surface S2. Depending on the process, a boundary between the plurality of insulating layers 111 may not be apparent. The lowermost insulating layer 111a and the uppermost insulating layer 111b may be solder resist layers protecting the redistribution layer 112 from external physical/chemical damage. The solder resist layer may include an insulating material, and may be formed using, for example, prepreg, ABF, FR-4, BT, or photo solder resist (PSR). In addition, for convenience of explanation, only five insulating layers 111 are illustrated in the drawings, but embodiments of the present inventive concept are not limited thereto. According to an example embodiment, fewer or more insulating layers 111 may be formed. Also, as an example, a core insulating layer 111c located in the middle among the plurality of insulating layers 111 may be thicker than the insulating layers 111 stacked thereabove or therebelow. The core insulating layer 111c may suppress warpage of the substrate by improving the rigidity of the substrate. The core insulating layer 111c may be formed using, for example, a copper clad laminate (CCL), an unclad copper clad laminate (unclad CCL), a glass substrate or a ceramic substrate. According to an example embodiment, the redistribution structure 110 may not include the core insulating layer 111c (refer to the example embodiment of FIG. 7).

The redistribution layer 112 may include a metal material including, for example, copper (Cu), aluminum (Al), silver (Ag), tin (Sn), gold (Au), nickel (Ni), lead (Pb), titanium (Ti), alloys thereof. The redistribution layer 112 may include, for example, a ground (GND) pattern, a power (PWR) pattern, and a signal (S) pattern. The signal (S) pattern may provide a path through which various signals except for the ground (GND) pattern and the power (PWR) pattern, for example, a data signal, are transmitted/received. The redistribution layer 112 may be provided as a plurality of redistribution layers 112 respectively disposed on the plurality of insulating layers 111. The plurality of redistribution layers 112 may be electrically connected to each other through the redistribution vias 113. The redistribution layers 112 positioned in the lowermost and uppermost positions among the plurality of redistribution layers 112 may include a landing pad on which the semiconductor chip 120, the passive element 160, and the connection bump 170 are mounted. The landing pad may be formed to have a different pitch depending on an object mounted thereon. The number of layers of the redistribution layer 112 may be determined according to the number of layers of the insulating layer 111, and may include more or fewer layers than is illustrated in the drawings.

The redistribution vias 113 may be electrically connected to the redistribution layers 112 and may include a signal via, a ground via, and a power via. The redistribution vias 113 may include a metal material including, for example, copper (Cu), aluminum (Al), silver (Ag), tin (Sn), gold (Au), nickel (Ni), lead (Pb), titanium (Ti), or alloys thereof. The redistribution vias 113 may have a form of a filled via formed by filling the inside of the via hole with a metal material or a conformal via in which a metal material is formed along an inner wall of the via hole. The redistribution vias 113 may be integrated with the redistribution layers 112, but embodiments of the present inventive concept are not limited thereto.

The semiconductor chip 120 may include a connection pad 121 disposed on the first surface S1 of the redistribution structure 110 and electrically connected to the redistribution layer 112. The semiconductor chip 120 may include silicon (Si), germanium (Ge), or gallium arsenide (GaAs), and various types of integrated circuits may be formed therein. An integrated circuit may be a processor chip such as a central processor (e.g., CPU), a graphics processor (e.g., GPU), a field programmable gate array (FPGA), an application processor (AP), a digital signal processor, a cryptographic processor, a microprocessor, a microcontroller, etc., but is not limited thereto, and may be a logic chip such as an analog-to-digital converter, an ASIC (application-specific IC), or a memory chip such as a volatile memory (e.g., DRAM), non-volatile memory (e.g., ROM and flash memory). For example, the semiconductor chip 120 may be mounted on the redistribution structure 110 in a flip-chip manner. The semiconductor chip 120 may be connected to the redistribution layer 112 through ball or post-shaped metal bumps. For example, the semiconductor chip 120 may be electrically connected to the redistribution layer 112 through the solder bumps 125, but is not limited thereto. According to an example embodiment, the semiconductor chip 120 may be directly connected to the redistribution layer 112 or the wiring via 113 without a separate bump, or may be mounted on the redistribution structure 110 in a wire bonding manner. The connection pad 121 may be a pad (e.g., an aluminum (Al) pad) of a bare chip, but according to an example embodiment, it may be a pad of a packaged chip (e.g., a copper (Cu) pad).

The encapsulant 150 may encapsulate at least a portion of the semiconductor chip 120 on the first surface S1 of the redistribution structure 110. The encapsulant 150 may include, for example, a thermosetting resin such as an epoxy resin, a thermoplastic resin such as polyimide, or a prepreg including an inorganic filler and/or glass fiber, ABF, FR-4, BT, an epoxy molding compound (EMC). The encapsulant 150 may have a molded underfill (MUF) structure integrally formed with an underfill resin between the semiconductor chip 120 and the redistribution structure 110, but is not limited thereto. According to an example embodiment, the encapsulant 150 may have a capillary underfill (CUF) structure in which an underfill resin below the semiconductor chip 120 is separated.

The passive element 160 may be disposed on the second surface S2 of the redistribution structure 110 and may have a connection surface 160S1 on which a connection terminal 161 is disposed to face the second surface, a non-connection surface 160S2 positioned opposite to the connection surface 160S1, and a side surface 160S3 between the connection surface 160S1 and the non-connection surface 160S2, as illustrated in FIG. 1B. Here, the "non-connection surface" may refer to a surface positioned opposite to the surface facing the redistribution structure 110 and exposed externally of the semiconductor package. The passive element 160 may include, for example, a capacitor, an inductor, or beads. According to the present inventive concept, by introducing the sealing material 166 covering the non-connection surface 160S2 of the passive element 160, damage to the passive element 160 due to external impacts may be prevented.

The sealing material 166 may include an insulating resin similar to the encapsulant 150, for example, EMC. The sealing material 166 may be spaced apart from the connection bump 170 and may electrically insulate the passive element 160 and the connection bump 170 from each other. The sealing material 166 may have a maximum height H2 smaller than a maximum height H1 of the connection bump 170 in a direction (the Z-axis direction), perpendicular to the second surface S2. The sealing material 166 may cover the entirety of each of the connection surface 160S1 and the non-connection surface 160S2 of the passive element 16. Accordingly, the non-connection surface 160S2 of the passive element 160 may not be exposed from the sealing material 166. A thickness H3 of the sealing material 166 covering the non-connection surface 160S2 may be in the range of about 1 μm or more, for example, about 1 μm to about 7 If the thickness H3 of the sealing material 166 covering the non-connection surface 160S2 is less than about 1 at least a portion of the non-connection surface 160S2 may be exposed from the sealing material 166 to lower an effect of protecting the passive element 160. If the thickness H3 of the sealing material 166 covering the non-connection surface 160S2 exceeds about 7 μm the sealing material 166 may overflow. For example, the sealing material 166 may have a round (i.e., convex) surface 166RS facing in the same direction as the non-connection surface 160S2, and may cover at least a portion of each of the connection surface 160S1, the non-connection surface 160S2, and the side surface 160S3 of the passive element 160.

According to an example embodiment, only some passive elements 160a among the plurality of passive elements 160 may be covered by the sealing material 166. For example, the sealing material 166 may encapsulate only a passive element, for example, a first passive element 160a, which is relatively vulnerable to external impacts, among the first passive element 160a and a second passive element 160b. For example, the first passive element 160a is a chip-type silicon (Si) capacitor having high capacitance, and the second passive element 160b may be a ceramic capacitor such as a multilayer ceramic capacitor (MLCC) or a low inductance chip capacitor (LICC). The first passive element 160a may include a first connection terminal 161a and a first connection member 165a electrically connecting the first connection terminal 161a to the redistribution layer 112, and the second passive element 160b may include a second connection terminal 161b and a second connection member 165b electrically connecting the second connection terminal 161b to the redistribution layer 112. For example, the first connection member 165a may include a first pillar (i.e., post or other generally column-shaped structure) portion 162a in contact with the first connection terminal 161a and a first solder portion 163a connecting the first pillar portion 162a to the redistribution layer 112. The second connection member 165b may include a second connection terminal 161b and a second solder portion 163b in contact with the redistribution layer 112. The sealing material 166 may cover at least a portion of the first passive element 160a, for example, the non-connection surface 160S2, and may be spaced apart from the second passive element 160b. The lowermost redistribution layer 112 may include a first pad P1 in contact with the first connection member 165a and a second pad P2 in contact with the second connection member 165b, and the first pad P1 may have a width narrower than a width of the second pad P2 in a direction (e.g., the X-axis direction), parallel to the second surface S2. As such, in the present inventive concept, by selectively sealing only some passive elements 160a among the plurality of passive elements 160a and 160b, a process time may be shortened and the reliability of the passive elements 160a and 160b may be improved more efficiently.

The connection bump 170 may be disposed adjacently to the passive element 160 on the second surface S2 of the redistribution structure 110, and may be electrically connected to the redistribution layer 112. The connection bump 170 may physically and/or electrically connect the semiconductor package 100A to an external device. The connection bump 170 may include a conductive material and may have a ball, pin, or lead shape. For example, the connection bump 170 may be a solder ball. The connection bump 170 may have a maximum height H1 greater than a maximum height H2 of the sealing material 166 in a direction (the Z-axis direction), perpendicular to the second surface S2.

Figure 2:
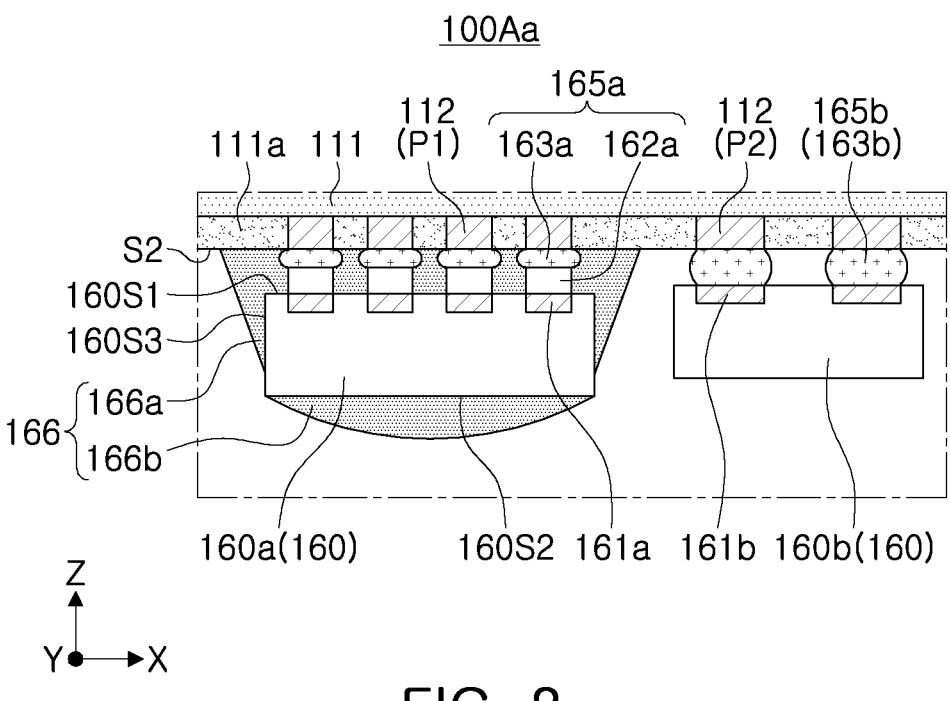
FIG. 2 is a partially enlarged view illustrating a modified example of a semiconductor package according to an example embodiment of the present inventive concept.

FIG. 2 is a partially enlarged view illustrating a modified example of a semiconductor package 100Aa according to an example embodiment of the present inventive concept. FIG. 2 shows a region corresponding to FIG. 1B in the semiconductor package 100Aa of the modified example.

Referring to FIG. 2, the semiconductor package 100Aa according to the modified example may have characteristics the same as or similar to those described above with reference to FIGS. 1A to 1C except that at least a portion of the side surface 160S3 of the passive element 160 is exposed from the sealing material 166, and thus, a redundant description thereof will be omitted. For example, the sealing material 166 may include a first region 166a covering the connection surface 160S1 and at least a portion of the side surface 160S3 of the passive element 160 and a second region 166b covering the non-connection surface 160S2 of the passive element 160, and the first region 166a and the second region 166b may be spaced apart from each other, as illustrated in FIG. 2. The first region 166a and the second region 166b may include the same material, but may include different materials according to another example embodiment. The sealing material 166 may be formed to cover the entire non-connection surface 160S2 of the passive element 160. A thickness of the sealing material 166 covering the non-connection surface 160S2 may be in the range of about 1 μm or more, for example, about 1 μm to about 4 μm, or about 1 μm to about 3 μm.

Figure 3:
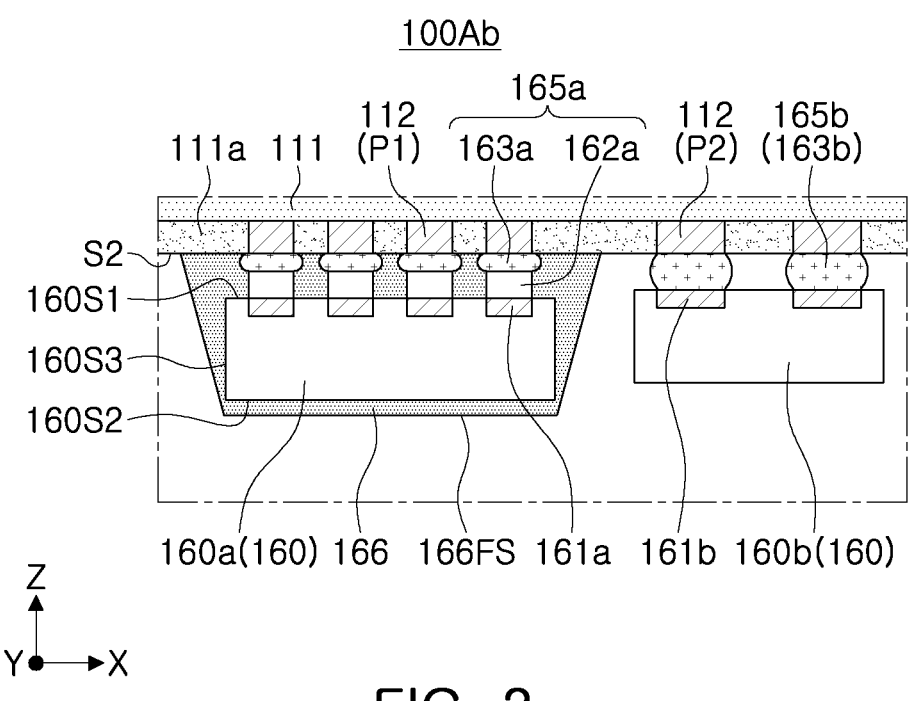
FIG. 3 is a partially enlarged view illustrating a modified example of a semiconductor package according to an example embodiment of the present inventive concept.

FIG. 3 is a partially enlarged view illustrating a modified example of a semiconductor package 100Ab according to an example embodiment of the present inventive concept. FIG. 3 illustrates a region corresponding to FIG. 1B in the semiconductor package 100Ab of the modified example.

Referring to FIG. 3, the semiconductor package 100Ab according to the modified example may have characteristics the same as or similar to those described above with reference to FIGS. 1A to 2, except that a portion of the sealing material 166 covering the non-connection surface 160S2 of the passive element 160 is planarized, and thus, a redundant description thereof will be omitted. In this modified example, the sealing material 166 may have a flat surface 166FS facing in the same direction as the non-connection surface 160S2. The flat surface 166FS may be formed by performing a milling process after the sealing material 166 is formed. A thickness of the sealing material 166 covering the non-connection surface 160S2 may be reduced to less than about 1 μm by the milling process, but the milling process may be performed so that the non-connection surface 160S2 of the passive element is not exposed. According to this modified example, since an overall height of the sealing material 166 is reduced, a height and pitch of the connecting bumps 170 may be formed to be smaller.

Figures 4A, 4B:
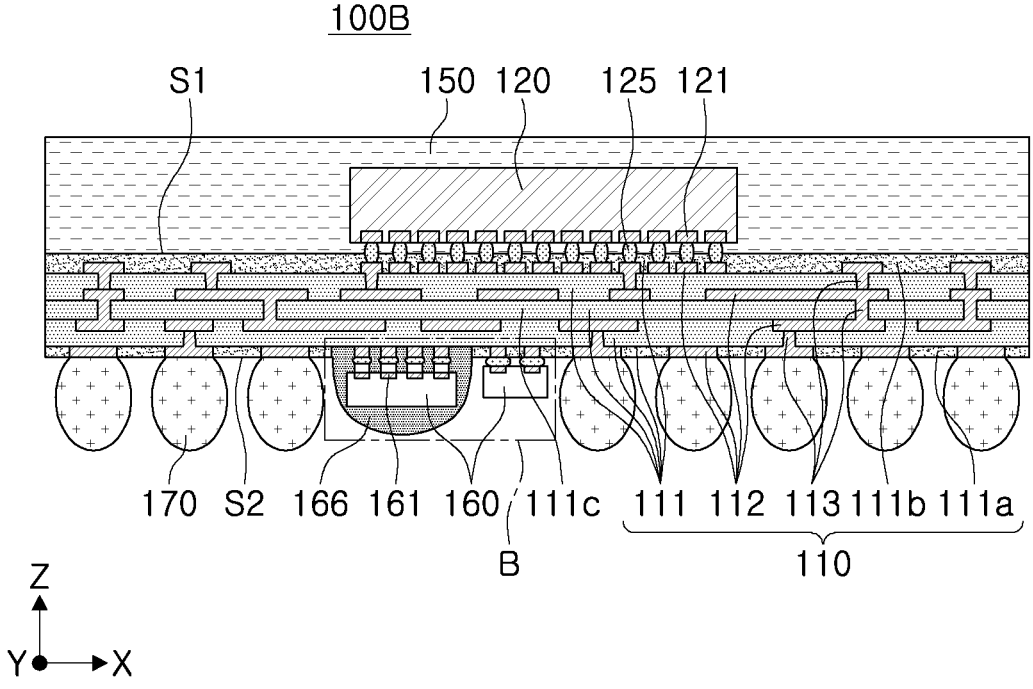
FIG. 4A is a cross-sectional view illustrating a semiconductor package according to an example embodiment of the present inventive concept.
FIG. 4B is a partially enlarged view illustrating region 'B' of FIG. 4A.

FIG. 4A is a cross-sectional view illustrating a semiconductor package 100B according to an example embodiment of the present inventive concept, and FIG. 4B is a partially enlarged view illustrating region 'B' of FIG. 4A.

Referring to FIGS. 4A and 4B, the semiconductor package 100B according to an example embodiment may have characteristics the same as or similar to those described above with reference to FIGS. 1A to 3, except that the second surface S2 of the redistribution structure 110 has a trench TR filled with the sealing material 166, and thus a redundant description thereof will be omitted. For example, the lowermost insulating layer 111a of the redistribution structure 110 may have a trench TR recessed from the second surface S2. The trench TR provides a filling space for the sealing material 166, thereby preventing the sealing material 166 from overflowing. Accordingly, at least a portion of the sealing material 166 may extend into the trench TR. The trench TR may be formed to expose the redistribution layer 112 or at least a portion of the landing pad P1 on which the passive element 160 is substantially mounted from the lowermost insulating layer 111a. For example, the lowermost insulating layer 111a may be a solder resist layer formed of PSR, and the trench TR may be formed using a photolithography process. In addition, the trench TR may expose the insulating layer 111 formed of a material (e.g., prepreg) other than PSR, thereby improving bonding strength of the sealing material 166. For example, the trench TR may be formed to expose at least a portion of the insulating layer 111 disposed on the lowermost insulating layer 111a, and the sealing material 166 may be in direct contact with the at least portion of the insulating layer 111 exposed by the trench TR. A shape of the trench TR is not limited to the shape illustrated in the drawings and may be variously modified (refer to the example embodiment of FIGS. 5A to 6B).

Figure 5A:
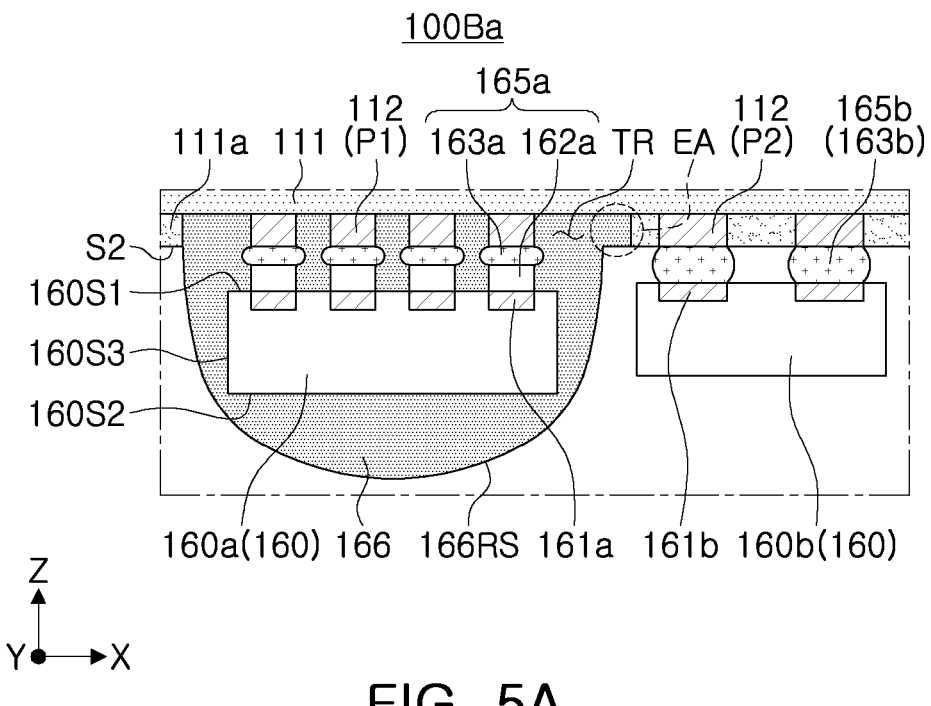
FIG. 5A is a partially enlarged view illustrating a modified example of a semiconductor package according to an example embodiment of the present inventive concept.
Figure 5B:
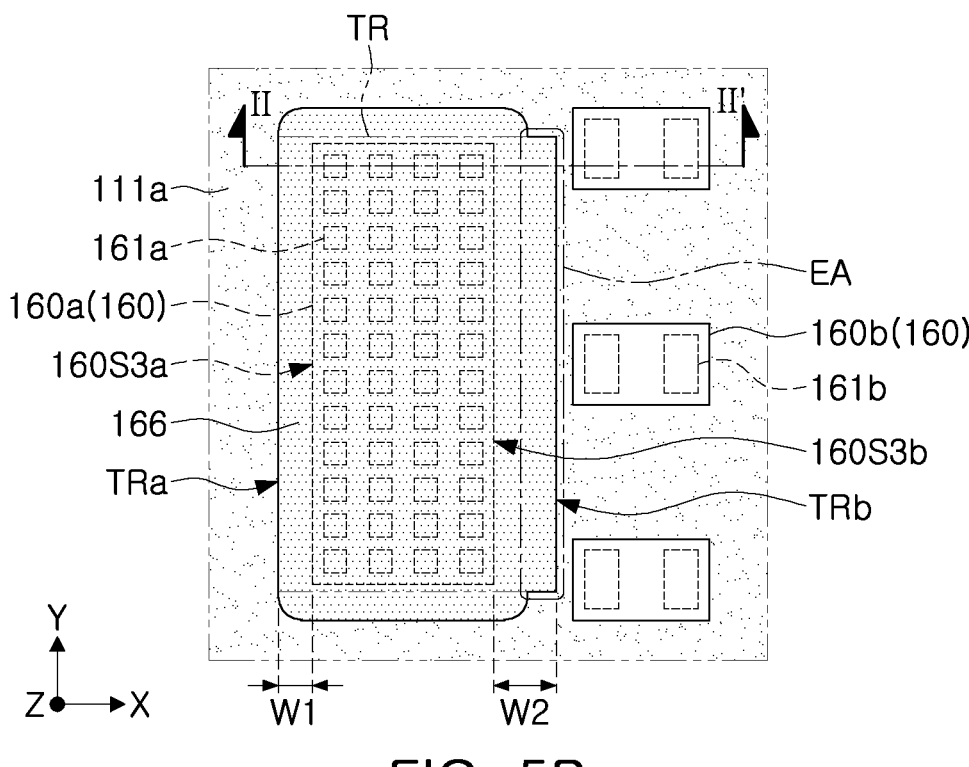
FIG. 5B is a plan view illustrating a lower surface of the semiconductor package of FIG. 5A.

FIG. 5A is a partially enlarged view illustrating a modified example of a semiconductor package 100Ba according to an example embodiment of the present inventive concept, and FIG. 5B is a plan view illustrating a lower surface of the semiconductor package 100Ba of FIG. 5A. FIG. 5A illustrates a region corresponding to FIG. 4B and a cross-section taken along line II-II' of FIG. 5B in the semiconductor package 100Ba of the modified example.

Referring to FIGS. 5A and 5B, the semiconductor package 100Ba according to the modified example may have characteristics the same as or similar to those described above with reference to FIGS. 4A and 4B except that the semiconductor package 100Ba has an extension area EA capable of preventing overflow of the sealing material 166. The trench TR of the present modified example may have the extension area EA extending in one direction. For example, the trench TR may have a first edge TRa facing a first side surface 160S3a of the first passive element 160a and a second edge TRb facing a second side surface 160S3b of the first passive element 160a, and a second width W2 between the second edge TRb and the second side surface 160S3b may be greater than a first width W1 between the first edge TRa and the first side surface 160S3a. At least a portion of the extension area EA may be filled with the sealing material 166. Since the extension area EA effectively suppresses overflow of the sealing material 166, the sealing material 166 may be formed more stably.

Figure 6A:
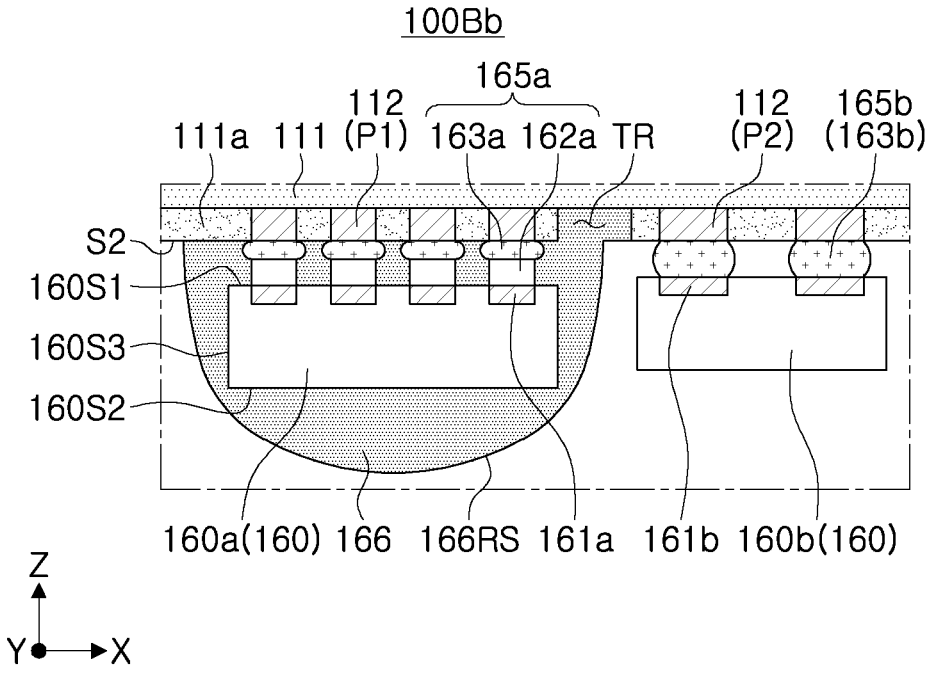
FIG. 6A is a partially enlarged view illustrating a modified example of a semiconductor package according to an example embodiment of the present inventive concept.
Figure 6B:
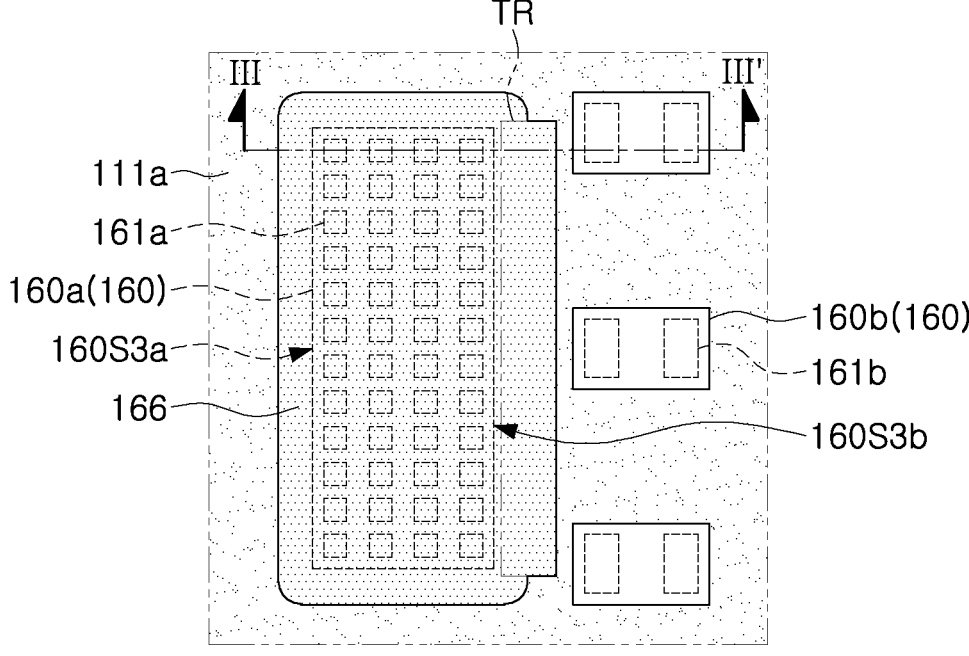
FIG. 6B is a plan view illustrating a lower surface of the semiconductor package of FIG. 6A.

FIG. 6A is a partially enlarged view illustrating a modified example of the semiconductor package 100Bb according to an example embodiment of the present inventive concept, and FIG. 6B is a plan view illustrating a lower surface of the semiconductor package 100Bb of FIG. 6A. FIG. 6A illustrates a region corresponding to FIG. 4B and a cross-section taken along line III-III' of FIG. 6B in the semiconductor package 100Bb of a modified example.

Referring to FIGS. 6A and 6B, the semiconductor package 100Bb according to the modified example may have characteristics the same as or similar to those described above with reference to FIGS. 4A and 4B. The trench TR of the present modified example may be formed so as not to expose the redistribution layer 112 on which the passive element 160 is mounted or the first pad P1, thereby protecting the redistribution layer 112 and suppressing overflow of the sealing material 166. For example, the trench TR may be formed adjacently to the second side surface 160S3b of the first passive element 160a and spaced apart from the first connection terminals 161a. Also, in this case, the trench TR may be formed to expose at least a portion of the insulating layer 111 (e.g., prepreg) disposed on the lowermost insulating layer 111a.

Figure 7:
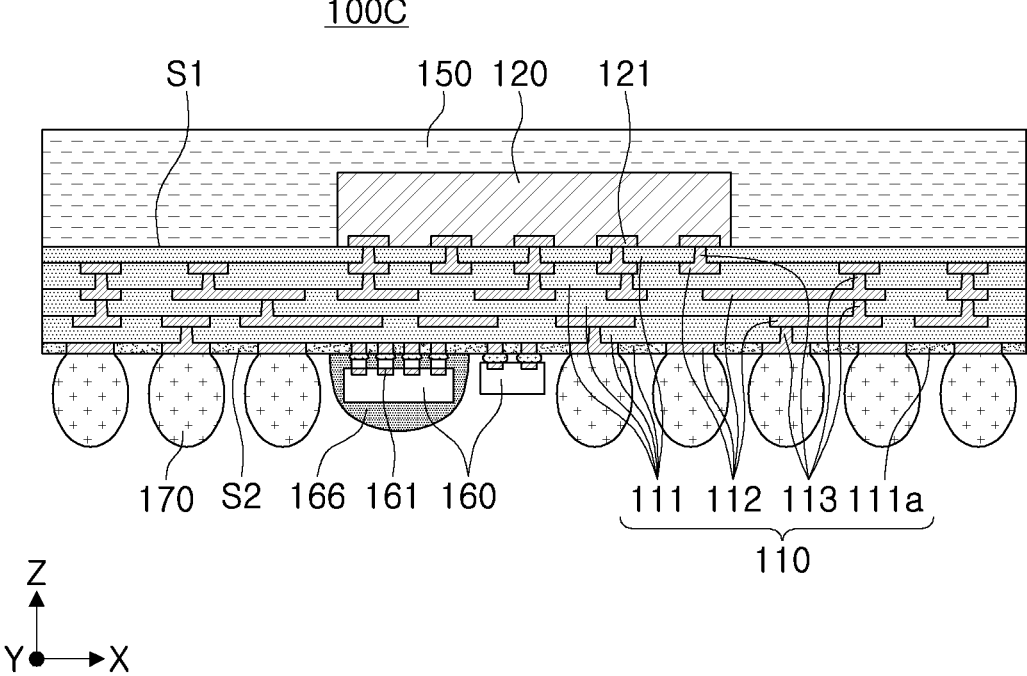
FIG. 7 is a cross-sectional view illustrating a semiconductor package according to an example embodiment of the present inventive concept.

FIG. 7 is a cross-sectional view illustrating a semiconductor package 100C according to an example embodiment of the present inventive concept.

Referring to FIG. 7, in the semiconductor package 100C according to an example embodiment, the connection pad 121 and the redistribution via 113 may be directly connected to each other without a separate connection member, e.g., the solder bump 125 of FIG. 1A. This structure may be implemented by encapsulating the semiconductor chip 120 using the encapsulant 150 on a temporary carrier and then directly forming the insulating layer 111, the redistribution layer 112, and the redistribution via 113 on a lower surface of the semiconductor chip 120 from which the temporary carrier is removed and the encapsulant 150. Accordingly, the connection pad 121 of the semiconductor chip 120 may be in direct contact with the redistribution via 113, and the redistribution via 113 may have a tapered shape with a width narrowing toward the first surface S1. According to the present example embodiment, the overall thickness of the semiconductor package 100C may be reduced and the connection reliability between the semiconductor chip 120 and the redistribution layer 112 (or the redistribution via 113) may be improved.

Figure 8:
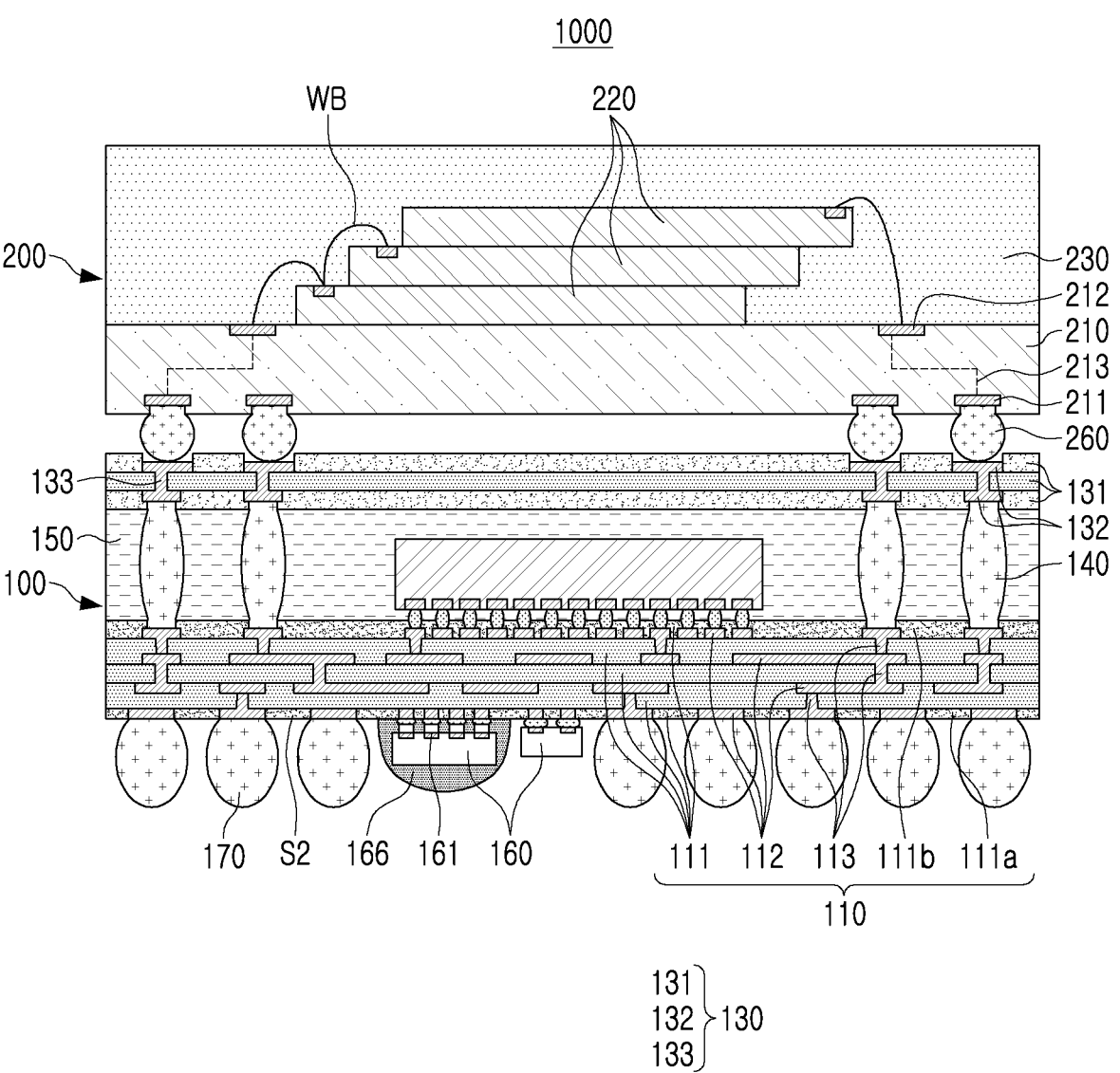
FIG. 8 is a cross-sectional view illustrating a semiconductor package according to an example embodiment of the present inventive concept.

FIG. 8 is a cross-sectional view illustrating a semiconductor package 1000 according to an example embodiment of the present inventive concept.

Referring to FIG. 8, the semiconductor package 1000 according to an example embodiment may include a first package 100 and a second package 200. The first package 100 may be understood as having characteristics the same as or similar to those of the semiconductor packages 100A, 100Aa, 100Ab, 100B, 100Ba, 100Bb, and 100C described above with reference to FIGS. 1A to 7, except that the first package 100 further includes an interposer substrate 130 and a connection structure 140.

The interposer substrate 130 is a redistribution substrate providing a redistribution layer on an upper or rear surface of the first package 100, and may be positioned between a lower package and an upper package in a package-on-package structure. The interposer substrate 130 may be disposed on the semiconductor chip 120 and may include an upper insulating layer 131, an upper wiring layer 132, and a wiring via 133. The upper insulating layer 131, the upper wiring layer 132, and the wiring via 133 may have characteristics the same as or similar to those of the insulating layer 111, the redistribution layer 112, and the redistribution via 113 of the redistribution structure 110 described above, and thus, a redundant description thereof will be omitted. The upper insulating layer 131 may also be provided as a plurality of insulating layers. The uppermost upper insulating layer 131 may include openings exposing at least a portion of the upper wiring layer 132.

The connection structure 140 may be disposed between the redistribution structure 110 and the interposer substrate 130 to electrically connect the redistribution structure 110 and the interposer substrate 130. The connection structure 140 may extend in a vertical direction (the Z-axis direction) between the redistribution structure 110 and the interposer substrate 130 to provide a vertical connection path electrically connecting the redistribution layer 112 to the upper wiring layer 132. The connection structure 140 may be formed of a low melting point metal, for example, tin (Sn), indium (In), bismuth (Bi), antimony (Sb), copper (Cu), silver (Ag), zinc (Zn), lead (Pb), or alloys thereof (e.g., Sn—Ag—Cu) and may have a spherical or ball shape. According to an example embodiment, a core ball formed of a polymer material including a thermoplastic resin, a thermosetting resin, or a metal material distinguished from solder may be disposed inside the connection structure 140.

The second package 200 may include a redistribution substrate 210, a second semiconductor chip 220, and a second encapsulant 230. The redistribution substrate 210 may include a lower pad 211 and an upper pad 212 provided on upper and lower surfaces thereof, respectively, and electrically connected to the outside (i.e., electrically connected to other elements and/or devices). Also, the redistribution substrate 210 may include a redistribution circuit 213 electrically connecting the lower pad 211 and the upper pad 212 to each other.

The second semiconductor chip 220 may be mounted on the redistribution substrate 210 by wire bonding or flip-chip bonding. For example, the plurality of second semiconductor chips 220 may be vertically stacked on the redistribution substrate 210 and electrically connected to the upper pad 212 of the redistribution substrate 210 by a bonding wire WB. For example, the second semiconductor chip 220 may include a memory chip, and the first semiconductor chip 120 of the first package 100 may include an application processor (AP) chip.

The second encapsulant 230 may include a material the same as or similar to that of the encapsulant 150 of the first package 100. The second package 200 may be physically and electrically connected to the first package 100 by a metal bumps 260. The metal bump 260 may be electrically connected to the redistribution circuit 213 inside the redistribution substrate 210 through the lower pad 211 of the redistribution substrate 210. The metal bump 260 may include a low melting point metal, for example, tin (Sn) or an alloy including tin (Sn).

The semiconductor package 1000 according to an example embodiment includes the first package 100 having improved PI and/or SI characteristics. Therefore, according to an embodiment of the present inventive concept, a package-on-package structure having excellent reliability may be implemented.

According to example embodiments of the present inventive concept, by introducing a sealing material for sealing a passive element, a semiconductor package in which damage to a passive element is prevented and PI characteristics are improved may be provided.

While example embodiments have been shown and described above, it will be apparent to those skilled in the art that modifications and variations could be made without departing from the scope of the present inventive concept as defined by the appended claims.

What is claimed is:

1. A semiconductor package comprising:
a redistribution structure comprising a first surface, an opposite second surface, and a redistribution layer between the first surface and the second surface;
a semiconductor chip on the first surface of the redistribution structure and electrically connected to the redistribution layer;
an encapsulant on the semiconductor chip;
a first passive element on the second surface of the redistribution structure, the first passive element comprising a connection surface facing the second surface of the redistribution structure, a connection terminal on the connection surface, a non-connection surface opposite to the connection surface, and a side surface extending from the connection surface to the non-connection surface;
a second passive element on the second surface of the redistribution structure and spaced apart from the first passive element;
a connection bump on the second surface of the redistribution structure and electrically connected to the redistribution layer, wherein the connection bump is adjacent to the first passive element; and
a sealing material on each of the connection surface, the non-connection surface, and the side surface of the first passive element,
wherein the sealing material selectively seals the first passive element without sealing the second passive element,
wherein the first passive element comprises a silicon capacitor, and
wherein the second passive element comprises a ceramic capacitor.

2. The semiconductor package of claim 1, wherein the sealing material is on an entirety of each of the connection surface and the non-connection surface of the first passive element.

3. The semiconductor package of claim 1, wherein a portion of the sealing material has a convex surface.

4. The semiconductor package of claim 1, wherein the sealing material has a maximum height that is lower than a maximum height of the connection bump in a direction perpendicular to the second surface.

5. The semiconductor package of claim 1, wherein a thickness of the sealing material on the non-connection surface of the first passive element is about 1 µm or greater.

6. The semiconductor package of claim 1, wherein the sealing material is on an entirety of the non-connection surface of the first passive element.

7. The semiconductor package of claim 1, wherein the sealing material comprises an insulating resin.

8. The semiconductor package of claim 1, wherein the first passive element further comprises a connection member between the second surface of the redistribution structure and the connection surface of the first passive element, wherein the connection member electrically connects the connection terminal to the redistribution layer.

9. The semiconductor package of claim 8, wherein the connection member comprises a portion electrically connected with the connection terminal and a solder portion electrically connecting the portion to the redistribution layer.

10. The semiconductor package of claim 1, wherein the sealing material comprises a first region on the connection surface of the first passive element and on the side surface of the first passive element, and a second region on the non-connection surface of the first passive element, wherein the first region and the second region are spaced apart from each other.

11. The semiconductor package of claim 1, wherein a portion of the sealing material on the non-connection surface has a flat surface.

12. A semiconductor package comprising:
a redistribution structure comprising a first surface, an opposite second surface, and a redistribution layer between the first surface and the second surface;
a semiconductor chip on the first surface of the redistribution structure and electrically connected to the redistribution layer;
a first passive element on the second surface of the redistribution structure, the first passive element comprising a first connection terminal and a first connection member electrically connecting the first connection terminal to the redistribution layer;
a second passive element on the second surface of the redistribution structure, the second passive element comprising a second connection terminal and a second connection member electrically connecting the second connection terminal to the redistribution layer; and
a sealing material on the first passive element,
wherein the first passive element comprises a silicon (Si) capacitor and the second passive element comprises a ceramic capacitor.

13. The semiconductor package of claim 12, wherein the sealing material does not contact the second passive element.

14. The semiconductor package of claim 12, wherein
the first connection member comprises a first portion electrically connected with the first connection terminal, and a first solder portion electrically connecting the first portion to the redistribution layer, and
the second connection member comprises a second solder portion electrically connecting the second connection terminal to the redistribution layer.

15. The semiconductor package of claim 12, wherein
the redistribution layer comprises a first pad electrically connected with the first connection member, and a second pad electrically connected with the second connection member, and
the first pad has a first width in a direction that is parallel to the second surface, the second pad has a second width in the direction, and wherein the first width is less than the second width.

16. A semiconductor package comprising:
a redistribution structure comprising a plurality of insulating layers and a plurality of redistribution layers between the plurality of insulating layers, wherein an uppermost one of the plurality of insulating layers forms a first surface of the redistribution structure, and wherein a lowermost one of the plurality of insulating layers forms an opposite second surface of the redistribution structure;
a semiconductor chip on the first surface of the redistribution structure and electrically connected to the plurality of redistribution layers;
a passive element on the second surface of the redistribution structure, the passive element comprising a connection surface facing the second surface of the redistribution structure, an opposite non-connection surface, and a connection terminal on the connection surface; and
a sealing material on the non-connection surface of the passive element, wherein the lowermost one of the plurality of insulating layers comprises a trench therein at the second surface of the redistribution structure,
wherein the trench has a bottom surface recessed away from the connection surface, and
wherein the sealing material extends from the non-connection surface of the passive element to the bottom surface of the trench.

17. The semiconductor package of claim 16, further comprising:
a connection bump on the second surface of the redistribution structure and electrically connected to the plurality of redistribution layers,
wherein the connection bump and the passive element are in adjacent, spaced-apart relationship.

18. The semiconductor package of claim 16, wherein the trench is configured such that at least a portion of an insulating layer on the lowermost one of the plurality of insulating layers is uncovered.

19. The semiconductor package of claim 18, wherein the sealing material is on the at least a portion of the insulating layer that is uncovered.

* * * * *